United States Patent [19]

Miyake

[11] Patent Number: 4,888,488

[45] Date of Patent: Dec. 19, 1989

[54] EXPOSING APPARATUS USED IN FABRICATION OF PRINTED CIRCUIT BOARDS

[76] Inventor: Eiichi Miyake, D3-304, 7 Shinsenriminami-machi 3-chome, Toyonaka-shi, Osaka, Japan

[21] Appl. No.: 274,439

[22] Filed: Nov. 22, 1988

[30] Foreign Application Priority Data

Mar. 15, 1988 [JP] Japan .............................. 63-34942[U]

[51] Int. Cl.$^4$ .............................................. G03B 27/04
[52] U.S. Cl. ............................. 250/492.1; 250/492.2; 378/34; 355/78; 355/87; 355/91
[58] Field of Search ............. 250/492.1, 492.2, 492.24, 250/440.1, 441.1; 375/34; 355/78, 87, 91

[56] References Cited

U.S. PATENT DOCUMENTS 3,625,611 12/1971 Orr et al. ................................ 355/87
4,648,106 3/1987 Novak ..................................... 378/34

Primary Examiner—Jack I. Berman
Attorney, Agent, or Firm—Lowe, Price, LeBlanc, Becker & Shur

[57] ABSTRACT

An exposing apparatus arranged, while peripherally sealing a space between an original and a material to be exposed by a packing of elastic material, to evacuate the space to thereby ensure intimate contact between the original and the material to be exposed, the exposing apparatus being characterized in that the packing is hollow so as to make it possible to change its thickness by changing its internal pressure.

5 Claims, 2 Drawing Sheets

EXPOSING APPARATUS USED IN FABRICATION OF PRINTED CIRCUIT BOARDS

BACKGROUND OF THE INVENTION

1. Field of the Invention

This invention relates to an exposing apparatus used for exposing photoresist films to light in fabrication of printed circuit boards and particularly to an exposing apparatus of the type in which the interface between the original and a material to be exposed is evacuated during exposure to ensure intimate contact therebetween.

2. Description of the Prior Art

For the positioning of the original and the material to be exposed, mechanical methods including the use of a pin or the like have been commonly used. However, in recent years, with the increasing pattern density of printed circuit boards, the mechanical methods described above have proved to be incapable of providing the required accuracy. Thus, a system is being increasingly used which employs an optical sensor, such as a CCD camera, to read marked positions associated with the original and the material to be exposed, so as to effect the positioning of the original and the material.

FIG. 5 shows a conventional exposure device using said CCD camera. In FIG. 5, an original 1 which is to become a photomask is held stuck to the lower surface of a transparent original holding plate 2, which is fixed to an original frame 3. The original frame 3 is made vertically movable, as indicated by double arrows 5, by a suitable number of vertical guide and air cylinder assemblies 4. A suitable number of CCD cameras 6 are disposed above the original 1.

A material to be exposed 7 which is to become a printed circuit board is placed on a material holding table 8. The holding table 8 is formed with a vacuum passage 9, which is connected to a vacuum source (not shown) through a valve 10. The vacuum passage 9 communicates with a plurality of suction holes 11 having their openings distributed in the upper surface of the holding table 8. The material to be exposed 7 is fixed on the holding table 8 in that a vacuum is imparted to each suction hole 11 through the vacuum passage 9.

The holding table 8 is connected to an X-Y-$\theta$ unit 12. The unit 12 is adapted to be actuated when the positioning of the original 1 and the material to be exposed 7 is to be effected, said unit 12 being designed to move the holding plate 8 in the X-direction and the Y-direction orthogonal thereto and rotate it, in the plane of the main surface of the material to be exposed 7.

A packing 13 of elastic material having a V-shaped cross-section is attached around the periphery of the holding table 8. The packing 13 is capable of contacting the aforesaid original holding plate 2. During the time the packing 13 is in contact with the original holding plate 2, the space 14 surrounded by the packing 13 is in the sealed state. To impart a vacuum to such space 14, the holding table 8 is formed with a vacuum passage 15, to which a vacuum source (not shown) is connected through a valve 16.

In the exposing apparatus shown in FIG. 5, to effect the positioning of the original 1 and the material 7, first, respective marks (not shown) applied to the original 1 and material 7 are read by the CCD cameras 6 and relative positional deviations of these marks are calculated by a computer (not shown). And according to the result of the calculation, the X-Y-$\theta$ unit 12 is actuated to move the material 7 through the holding table 8 in the X, Y and $\theta$ directions to achieve the positioning. When such positioning is to be effected, it is desirable that the original 1 and the material 7 be either superposed with a slight clearance (0.02-0.05 mm) therebetween or lightly contacted with each other.

When the positioning described above is completed, ultraviolet rays 17, for example, indicated by arrows are radiated. At this time, it is desirable that the original 1 and the material 7 be intimately contacted. For this reason, a vacuum is imparted to the space 14 via the vacuum passage 15.

In the above exposure operation, the function or behavior of the packing 13 will now be considered.

The packing 13 is formed of elastic material as described above and, as shown in FIG. 5, since the space 14 has to be sealed when the original holding plate 2 is lowered to the extent that at least the original 1 and the material 7 come in contact with each other, it is undesirable to make the arrangement so that it is not until the original 1 and the material 7 come in contact with each other that the packing 13 comes in contact with the original holding plate 2. In other words, the packing 13 has to be designed so that it begins to contact the original holding plate 2 in the course of downward movement of the original holding plate 2.

As can be seen from such function or behavior of the packing 13, when the positioning of the original 1 and the material 7 is to be effected, even if there is a slight clearance therebetween it follows that the packing 13 has already been kept in contact with the original holding plate 2. For this reason, the contact of the packing 13 with the original holding plate 2 produces a substantial resistance when the material holding table 8 is moved in the X, Y and $\theta$ directions. Such resistance constitutes a serious obstacle to moving the original 1 and the material 7 relative to each other with high accuracy in the X, Y and $\theta$ directions in an effort to effect the positioning thereof.

SUMMARY OF THE INVENTION

Accordingly, an object of the invention is to provide an exposing apparatus capable of solving said problems.

This invention is directed to an exposing apparatus arranged, while peripherally sealing the space between the original and the material by a packing of elastic material, to evacuate said space to thereby ensure intimate contact between the original and the material to be exposed. To solve the above technical problem, the following arrangement is employed.

An improvement to be particularly noted in this invention is directed to said packing, residing in the fact that the packing is hollow so as to make it possible to change its thickness by changing its internal pressure.

According to this invention, only when contact between the original and the material is to be effected for the purpose of exposure by evacuating the space between the original and the material, the packing has its thickness dimension relatively increased to contact the associated surface so as to seal the space between the original and the material. On the other hand, when the positioning of the original and the material is to be effected, the packing has its internal pressure decreased as compared with the aforesaid state, whereby its thickness dimension is relatively decreased. Thereby, the packing is prevented from contacting the associated surface. Therefore, when the original and the material to be exposed are moved relative to each other, there is no longer a resistance otherwise arising from contact with the packing; thus, high precision positioning becomes possible.

Further, according to this invention, upon completion of the exposure step performed while sealing the periphery of the space between the original and the material to be exposed, the thickness dimension of the packing can be relatively decreased; therefore, release of the vacuum in the space surrounded by the packing can be quickly effected and hence the operating time saved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
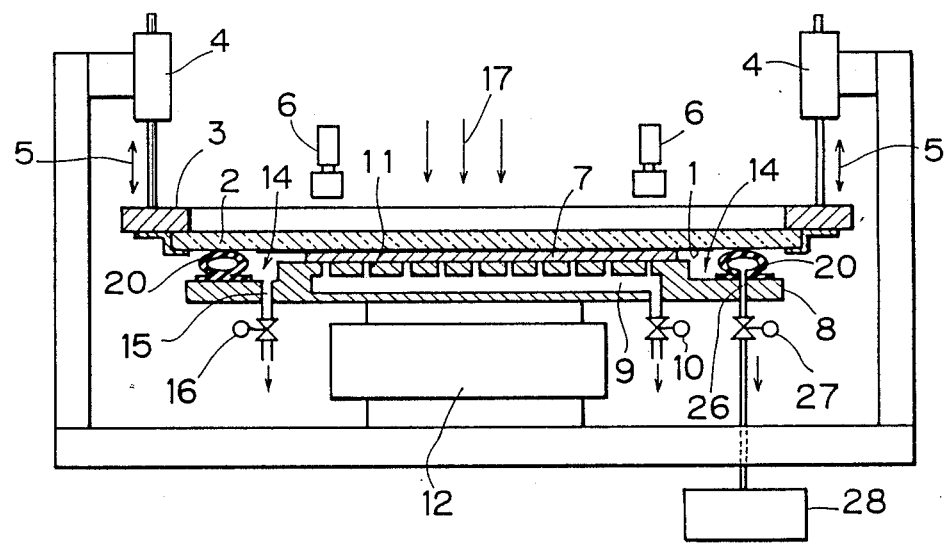
FIG. 1 is a front view of an exposing apparatus according to an embodiment of the invention, showing a packing 20 having its thickness dimension relatively increased.
Figure 2:
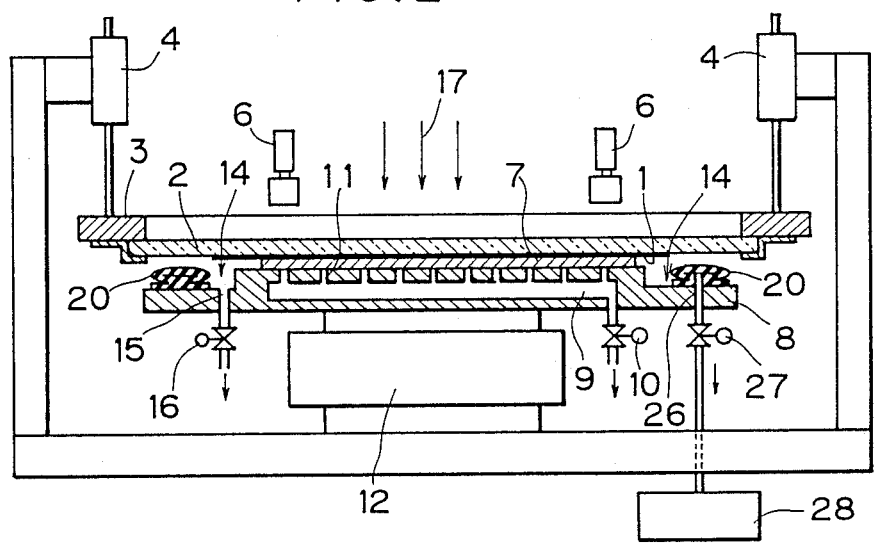
FIG. 2 is a front view of the exposing apparatus of FIG. 1, showing the packing 20 having its thickness dimension relatively decreased.
Figure 3:
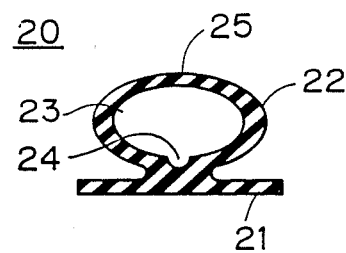
FIG. 3 is an enlarged sectional view of the packing 20 using in the exposing apparatus shown in FIGS. 1 and 2.

Referring to FIGS. 1 through 3, an embodiment of the invention will now be described.

Figure 5:
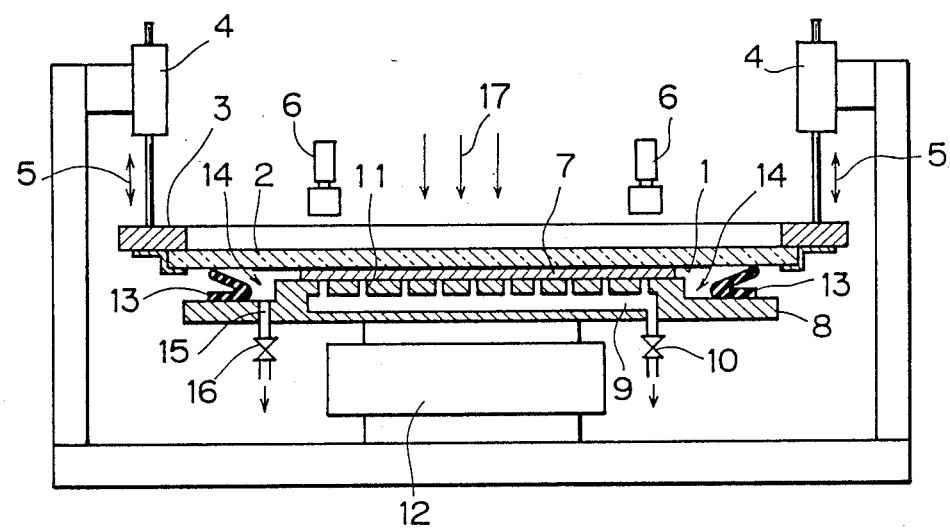
FIG. 5 is a front view of a conventional exposing apparatus.

FIGS. 1 and 2 are views corresponding to FIG. 5 showing the conventional exposing apparatus described above. As can be easily understood from a comparison between FIGS. 1 and 2 and FIG. 5, there are many common elements. Therefore, in FIGS. 1 and 2, the elements corresponding to those shown in FIG. 5 are indicated by the same reference numerals to omit a repetitive description.

The exposing apparatus shown in FIGS. 1 and 2 essentially differs from the conventional exposing apparatus shown in FIG. 5 in that a packing 20 of hollow construction is used in place of the packing 13 of V-shaped cross-section. The packing 20 is shown in cross-section enlarged in FIG. 3. The packing 20 is formed of elastic material, such as rubber. The packing 20 has an attaching portion 21 for attaching the packing 20 to the material holding table 8, and a hollow structure portion 22 disposed above said attaching portion 21. The hollow structure portion 22 has a horizontally disposed oblong cross-section, with a cavity 23 defined in the interior. The wall surface defining the lower surface of the cavity 23 is formed with a recessed groove 24. The top surface of the hollow structure portion 22 of the packing 20 serves as a contact portion 25 for contacting the original holding plate 2.

Communicating with the cavity 23 of the hollow structure portion 22 of the packing 20, as shown in FIG. 1, a vacuum passage 26 is formed in the material holding table 8. The vacuum passage 26 is connected to a vacuum source 28 through a valve 27.

In the state shown in FIG. 1, the internal pressure in the cavity 23 of the packing 20 is relatively high to cause the contact portion 25 to contact the original holding plate 2, thereby sealing the space surrounded by the packing 20. On the other hand, in the state shown in FIG. 2, the internal pressure in the cavity 23 of the packing 20 is relatively low to thereby decrease the thickness dimension, that is, height dimension of the packing 20, with the contact portion 25 being out of contact with the original holding plate 2.

The exposure operation to be performed in the exposing apparatus shown in FIGS. 1 and 2 will now be described.

In the initial stage, the original holding plate 2, which holds the original 1, and the original frame 3 are positioned at the upper limit by the vertically movable guide and air cylinder assemblies 4. In this state, the material to be exposed 7 is placed on the material holding table 8. At this time, the valve 10 is in the opened position, applying a vacuum suction force to each suction hole 11 via the vacuum passage 9, whereby the material to be exposed 7 is fixed on the holding table 8. Then, the original frame 3 and the original holding table 8 are lowered by the vertically movable guide and air cylinder assemblies 4, and the original 1 is also lowered until it either lightly contacts the material to be exposed 7 or is superposed thereabove with a slight clearance therebetween.

In the latest, the valve 27 is opened in the above stage to decrease the internal pressure in the cavity 23 of the packing 20, so that the packing 20, as shown in FIG. 2, has its height dimension decreased, with the packing 20 held out of contact with the original holding plate 2. In addition, even after the cavity 23 has been crushed partially somewhere along the length of the packing 20 by a negative pressure applied via the vacuum passage 26, the recessed groove 24 formed in the cavity 23 of the packing 20 makes it possible to continue the application of such negative pressure along the entire length of the packing 20.

In addition, such recessed groove 24 is optional in its position, shape and number so long as the above-described function is executed. For example, in addition to or in place of the recessed groove 24, a similar recessed groove may be formed on the wall surface defining the upper surface of the cavity 23.

In the state shown in FIG. 2, CCD cameras 6 are used to obtain data on the positioning, and the X-Y-$\theta$ unit 12 is actuated on the basis of said data, causing the holding table 8 to move the material 7 in the X, Y and $\theta$ directions. Thereby, the positioning of the original 1 and the material to be exposed 7 is achieved.

Upon completion of the aforesaid positioning, the internal pressure in the cavity 23 of the packing 20 is increased to establish the state of FIG. 1 wherein the contact portion 25 of the packing 20 contacts the original holding plate 2. In this state, the valve 16 is opened to evacuate the space 14, whereby the original 1 and the material to be exposed 7 are intimately contacted with each other. And exposure is effected by ultraviolet rays 17 being radiated to the material 7 through the original 1.

To take out the material 7 which has undergone such exposure treatment, first the valve 16 is closed and concurrently the valve 27 is opened. In response thereto, the packing 20 is separated from the original holding plate 2, as shown in FIG. 2, as the vacuum in the space 14 is removed. Subsequently, the original 1 is raised and the material 7 is taken out.

The operation described above will be repeated.

While the illustrated embodiment of the invention has so far been described, another embodiment is possible within the scope of the invention.

Figure 4:
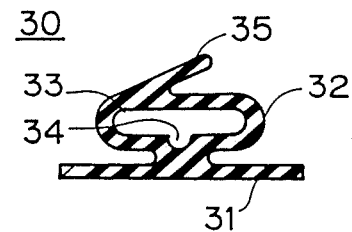
FIG. 4 is an enlarged sectional view of a packing 30 which can be used in place of the packing 20 shown in FIG. 3.

For example, the packing may have any cross-sectional shape so long as it has a hollow construction. For example, a packing 30 having a cross-sectional shape shown in FIG. 4 may be used. The packing 30 has an attaching portion 31 and a hollow structure portion 32. The hollow structure portion 32 is flatter than the hollow structure portion 22 shown in FIG. 3. The hollow structure portion 32 is formed with a cavity 33 and the lower surface which defines the underside the cavity 33 is formed with a recessed groove 34. The recessed groove 34 performs the same function as that of the recessed groove 24 described above. The contact portion 35 for contacting the original holding plate 2 is in the form of a projection extending obliquely upward from the hollow structure portion 32.

Further, as for the method of changing the thickness dimension of the packing by changing the internal pressure therein, various forms may be used. In the illustrated embodiment, for example, the packing 20 assumes the state of FIG. 1 when its internal pressure is atmospheric, while it assumes the state of FIG. 2 when its internal pressure is subatmospheric. However, the arrangement is not limited to the illustrated one; for example, it may be arranged that when the internal pressure in the packing 20 is atmospheric, the packing 20 assumes the state of FIG. 2, while to assume the state of FIG. 1, the internal pressure is increased. In this case, the block 28 shown in FIGS. 1 and 2 is arranged to serve as a pressure source. Further, it is also possible to arrange the apparatus so that in the state of FIG. 1, the internal pressure in the packing 20 is superatmospheric, while in the state of FIG. 2 the internal pressure is subatmospheric.

The packing 20 has been attached to the material holding table 8; it may be arranged so that it is attached to the original holding plate 2 with its contact portion 25 placed in contact with the material holding table 8.

Further, the portion to which the packing is attached and the portion with which it comes in contact are not limited to the material holding table 8 and the original holding plate 2 as illustrated; so long as the space between the original 1 and the material to be exposed 7 can be evacuated while sealing its periphery, the positions where the packing is attached and contacted may be other portions of the exposing apparatus.

In the illustrated embodiments, the material to be exposed 7 has been moved for the positioning of the original 1 and the material to be exposed 7; however, the arrangement may be made so that the original 1 is moved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An exposing apparatus comprising: means for holding an original;
   means for holding a material to be exposed so that said material is parallel to said original;
   packing means of elastic material having a thickness dimension and arranged so that a space defined between said original and said material is peripherally sealed by compressing said packing means in the direction of the thickness;
   said packing means being of hollow construction having a cavity and designed so that said thickness dimension can be changed by changing the internal pressure in said cavity;
   pressure control means for changing the internal pressure in said cavity;
   means for imparting a vacuum to said space which is sealed by said packing means and which is defined between said original and said material to be exposed, whereby said original and said material to be exposed are intimately contacted with each other.

2. An exposing apparatus as set forth in claim 1, wherein said packing means extends in a longitudinal direction which is orthogonal to the direction of said thickness.

3. An exposing apparatus as set forth in claim 2, wherein said cavity in said packing means extends in said longitudinal direction and has a recessed groove extending in said longitudinal direction and formed on its wall surface which defines said cavity.

4. An exposing apparatus as set forth in claim 1, wherein said pressure control means includes means for selectively imparting a vacuum to said cavity.

5. An exposing apparatus as set forth in claim 1, wherein said pressure control means includes means for selectively imparting compressed air to said cavity.

* * * * *